(12) United States Patent
Abdelli et al.

(10) Patent No.: US 8,085,091 B2
(45) Date of Patent: Dec. 27, 2011

(54) GAIN CONTROL AMPLIFIER

(75) Inventors: Said Abdelli, Minneapolis, MN (US); Jeffrey Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 16 days.

(21) Appl. No.: 12/694,734

(22) Filed: Jan. 27, 2010

(65) Prior Publication Data

US 2011/0181357 A1    Jul. 28, 2011

(51) Int. Cl.
*H03F 3/45* (2006.01)
(52) U.S. Cl. .................................................. 330/254
(58) Field of Classification Search ............ 330/254, 330/284
See application file for complete search history.

(56) References Cited

U.S. PATENT DOCUMENTS

| | | | |
|---|---|---|---|
| 6,265,936 B1 | 7/2001 | Heigl et al. | |
| 6,278,321 B1 * | 8/2001 | Franck | 330/254 |
| 6,316,997 B1 | 11/2001 | Tammone, Jr. | |
| 6,414,547 B1 | 7/2002 | Shkap | |
| 6,868,262 B2 | 3/2005 | Gonya, Sr. | |
| 6,933,783 B2 | 8/2005 | Banba | |
| 6,982,596 B2 | 1/2006 | Kumeta et al. | |
| 7,002,411 B2 | 2/2006 | Yeh | |
| 7,135,926 B2 | 11/2006 | Caresosa et al. | |
| 7,209,004 B2 | 4/2007 | Gregorius et al. | |
| 7,332,967 B2 | 2/2008 | Rogers et al. | |
| 7,417,506 B2 | 8/2008 | Klein et al. | |
| 7,443,240 B2 | 10/2008 | Katsunaga et al. | |
| 7,477,888 B2 | 1/2009 | Behzad | |
| 7,532,070 B2 | 5/2009 | Cowley et al. | |
| 2005/0017808 A1 * | 1/2005 | Kimura et al. | 330/254 |

* cited by examiner

*Primary Examiner* — Steven J Mottola
(74) *Attorney, Agent, or Firm* — Shumaker & Sieffert, P.A.

(57) ABSTRACT

Systems, methods, and devices provided herein are directed to improvements in gain control amplifiers that receive an input signal and generate an output signal with a selectively variable gain. A differential amplified gain stage receives an input signal and scales the input signal to generate a scaled signal. A gain adjust stage receives the scaled signal and an adjust signal and adjusts an amplitude of the scaled signal based on the adjust signal to generate an adjusted scaled signal. The adjusted scaled signal has a substantially constant impedance regardless of value of the adjust signal.

20 Claims, 9 Drawing Sheets

GAIN CONTROL AMPLIFIER

STATEMENT REGARDING FEDERALLY SPONSORED RESEARCH OR DEVELOPMENT

This invention was made with Government support under subcontract 02ESM162076 awarded by General Dynamics. The Government has certain rights in the invention.

TECHNICAL FIELD

The invention relates to gain control amplifier circuits.

BACKGROUND

In many communications system, e.g. radio frequency (RF) communications systems, it is desirable for a signal receiver to scale, or apply a gain to, an incoming signal for further processing or subsequent retransmission of the signal. Because an amplitude of an incoming signal may vary, it is also desirable to implement circuits that apply a selectively adjustable gain to an input signal. Such circuits may be referred to as gain control amplifiers. Gain adjustment may cause undesirable limitations on signal bandwidth, specifically at high frequencies.

SUMMARY

This disclosure is directed to improvements in gain control amplifiers. Various examples described herein enable amplification of a signal with beneficial performance across a large bandwidth, including at high frequencies. In some aspects, examples described herein may provide for a gain control amplifier that outputs a scaled signal with a substantially constant impedance, regardless of a level of scaling applied to a signal by the amplifier. In other aspects, examples described herein may provide for a gain control amplifier that outputs a scaled signal at a substantially constant impedance across a large bandwidth of frequencies. In still other aspects, examples described herein may provide for a gain control amplifier that operates with minimized power dissipation.

In one example, an amplifier device is described herein. The amplifier device includes a differential amplifier gain stage that receives an input signal and applies a gain to the input signal to generate a scaled signal. The amplifier device further includes a gain adjust stage that receives the scaled signal and an adjust signal and adjusts an amplitude of the scaled signal based on the adjust signal and outputs an adjusted scaled signal. The adjusted scaled signal has a substantial constant impedance regardless of a value of the adjust signal.

In another example, a method is described herein. The method includes receiving, at a differential amplifier stage, an input signal. The method further includes scaling, by the differential amplifier stage, the input signal to generate a scaled signal. The method further includes receiving, at a gain adjust stage, the scaled signal. The method further includes receiving, at the gain adjust stage, an adjust signal. The method further includes adjusting an amplitude of the scaled signal by the gain adjust stage. The method further includes outputting an adjusted scaled signal, wherein the adjusted scaled signal has a substantially constant impedance regardless of a value of the adjust signal.

In another example, a device is described herein. The device includes means for scaling an input signal to output a scaled signal. The device further includes means for receiving the scaled signal and an adjust signal. The device further includes means for adjusting an amplitude of the scaled signal based on the adjust signal. The means for adjusting an amplitude of the scaled signal output an adjusted scaled signal with a substantially constant impedance regardless of a value of the adjust signal.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
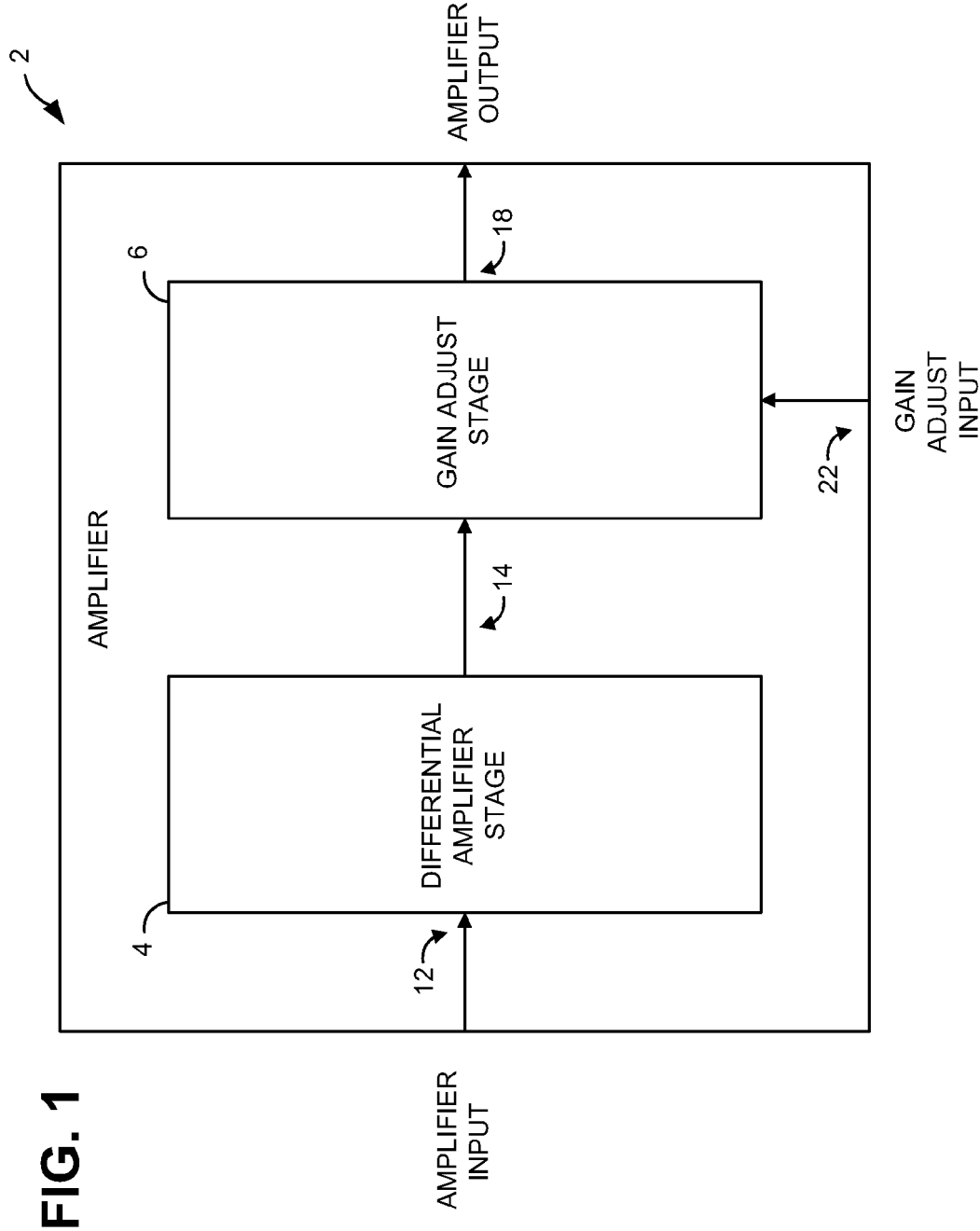
FIG. 1 is a block diagram depicting one example of a gain control amplifier consistent with this disclosure.

FIG. 1 is a block diagram illustrating one example of an amplifier consistent with this disclosure. Generally speaking, amplifier 2 may receive an input signal, apply a gain to the input signal, and generate an amplified output signal.

Amplifier 2 includes a differential amplifier stage 4 and a gain adjust stage 6. Differential amplifier stage 4 may receive an input signal 12. Input signal 12 may be a differential input signal, where the input signal is represented by two signals of opposite polarity, e.g. a positive input signal and a negative input signal. Differential amplifier stage 4 may apply a gain to an input signal 12, and output a scaled signal 14. The scaled signal 14 may be amplified (gain of greater than unity) or attenuated (gain of less than unity). In one example, the scaled signal 14 is a differential signal.

Gain adjust stage 6 may receive the scaled signal 14, adjust an amplitude of the scaled signal 14, and output an adjusted scaled signal 18. As also shown in FIG. 1, gain adjust stage 6 may receive an adjust signal 22. Gain adjust stage 6 may adjust an amplitude of scaled signal 16 based on a value of adjust signal 22.

Gain adjust stage 6 may output adjusted scaled signal 18. Adjusted scaled signal 18 may define a substantially constant impedance. In one example, gain adjust module 6 may output an adjusted scaled signal 18 that defines a substantially constant impedance regardless of a level of amplitude adjustment of gain adjust stage 6.

The gain of amplifier 2 may be selectively adjusted via adjust signal 22. In one example, the gain of amplifier 2 may be manually adjusted by a user. In another example, although not depicted herein, amplifier 2 may include additional circuitry, programmable logic, or other devices that detect amplitudes of signals input to amplifier 2, and correspondingly adjust the gain of amplifier 2 via adjust signal 22.

Figure 2:
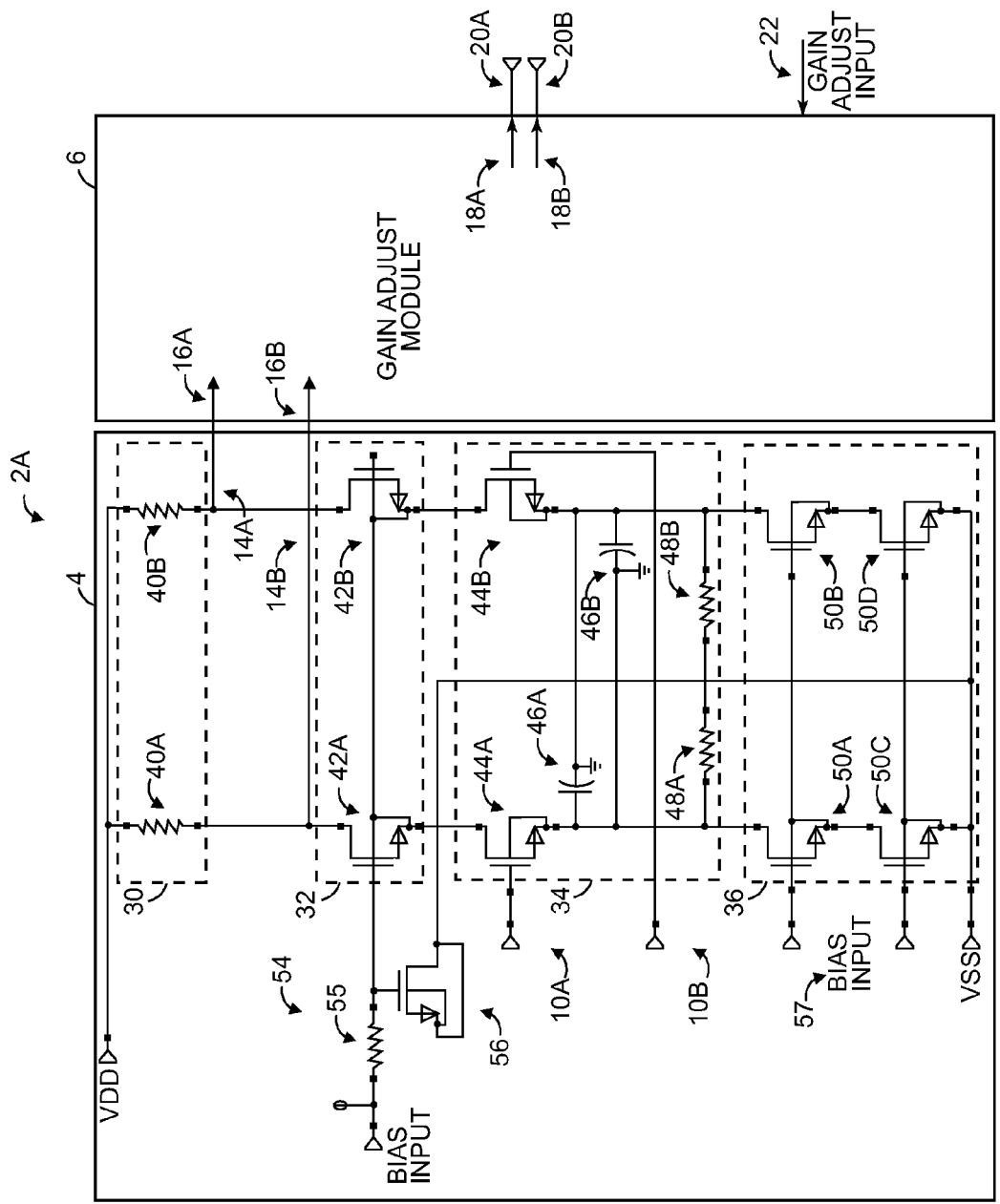
FIG. 2 is a circuit diagram depicting one example of a differential amplifier stage coupled to a gain stage consistent with this disclosure.

FIG. 2 is a circuit diagram that depicts one example of an amplifier circuit 2A consistent with this disclosure. As shown in FIG. 2, amplifier 2A includes differential amplifier stage 4 and gain adjust stage 6.

As shown in FIG. 2, differential amplifier stage 4 includes differential amplifier circuit 34. Differential amplifier circuit 34 is receives first and second polarity signals 10A and 10B of a differential signal, and outputs corresponding first and second polarity signals 14A and 14B (e.g., signals that are 180 degrees out of phase) as a scaled signal. Differential amplifier circuit 34 may receive first polarity signal 10A of a differential signal, and a second polarity signal 10B of the differential signal (e.g. plus and minus polarities, however DC-biased differential signals are also contemplated). The first and second polarity signals 10A, 10B may be received by respective inputs of transistors 44A and 44B of differential amplifier circuit 34, e.g. at respective gates of transistors 44A and 44B.

Differential amplifier circuit 34 may also include a pair of capacitors 46A and 46B coupled between transistors 44A and 44B. Capacitors 46A-46B may operate as a filter, e.g. a high-pass filter. In the depicted example of FIG. 2, capacitors 46A-46B are coupled between respective source terminals of transistors 44A and 44B, and to ground. Differential amplifier circuit 34 also may include resistors 48A and 48B. In the depicted example of FIG. 2, resistors 48A and 48B are coupled between respective source terminals of transistors 44A and 44B. A resistance of resistors 48A and 48B may determine a gain of differential amplifier circuit 34.

Figure 3:
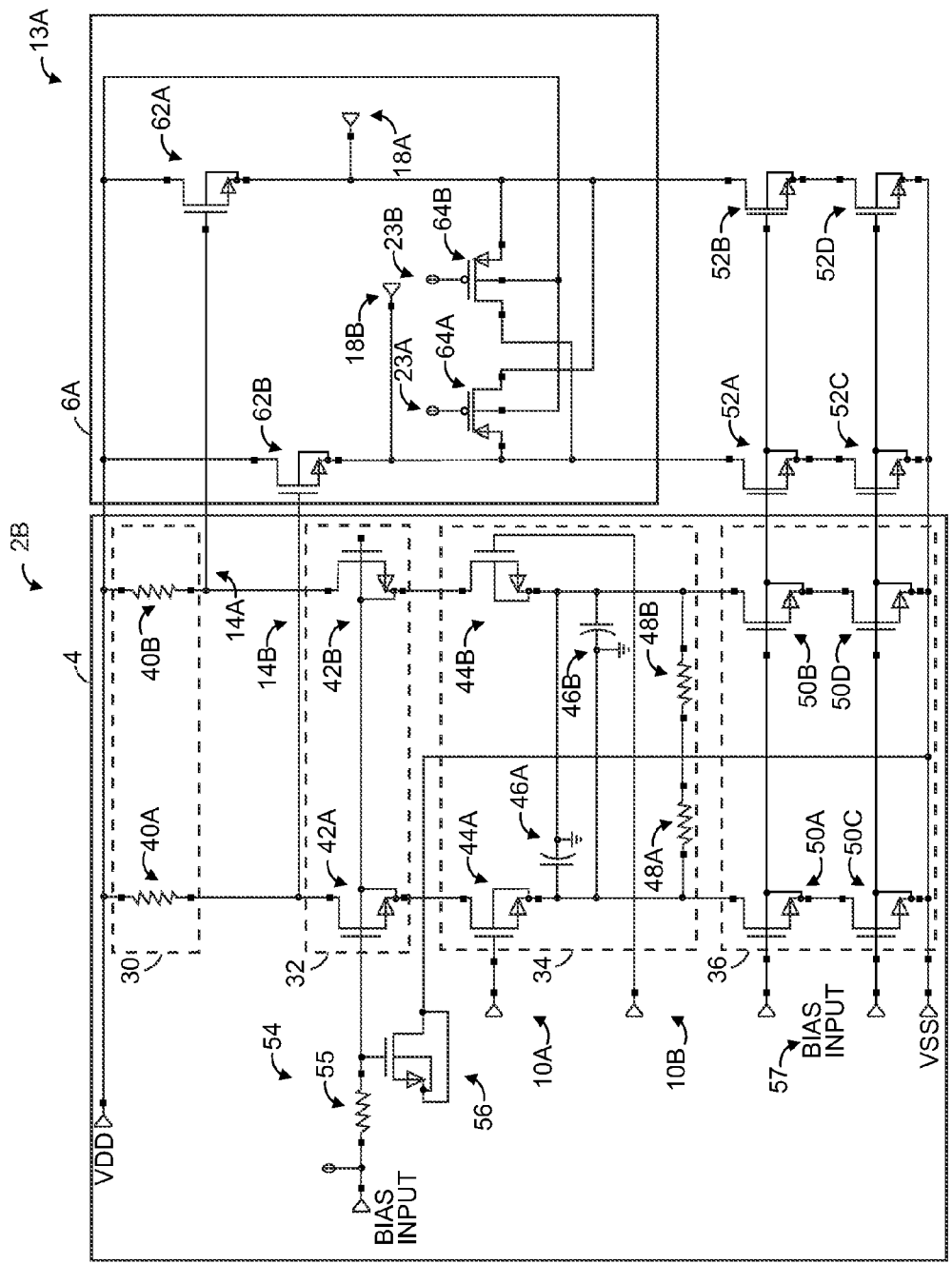
FIG. 3 is a circuit diagram depicting one example of a differential amplifier stage coupled to a gain stage that includes a source follower circuit consistent with this disclosure.
Figure 4:
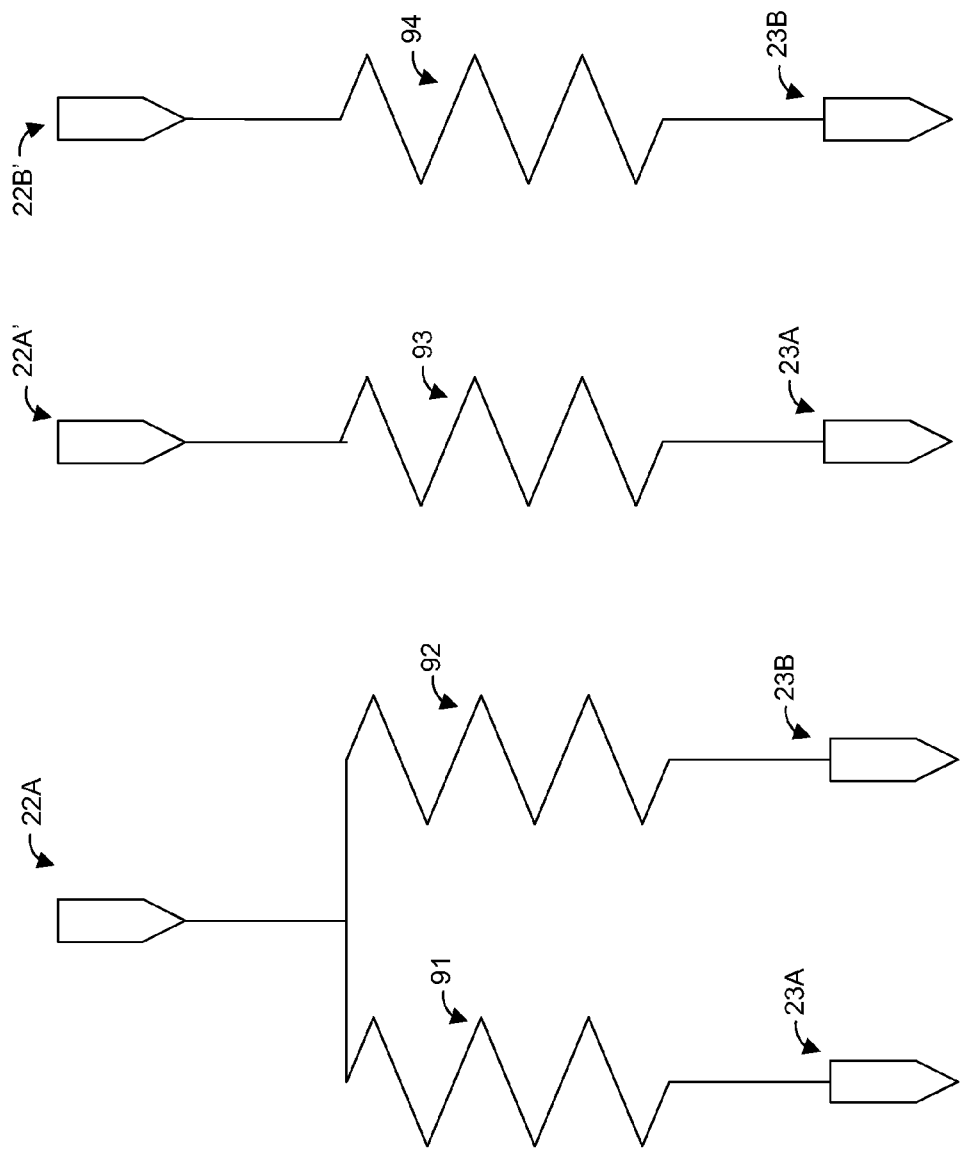
FIG. 4A is a circuit diagram depicting one example of an input circuit for an adjust signal consistent with this disclosure.
FIG. 4B is a circuit diagram depicting another example of an input circuit for an adjust signal consistent with this disclosure.

Differential amplifier stage 4 may also include current source circuit 36. Current source circuit 36 may supply a substantially constant current to differential amplifier stage 4. The substantially constant current may act as a bias for operation of transistors 42A-42B and 44A-44B of differential amplifier stage 4. Current source circuit 36 may include transistors 50A-50D, each of which include a gate coupled to one or more bias inputs 57. In the example of FIG. 3, transistors 50A and 50B each include drain terminals coupled to respective source terminals of transistors 44A and 44B, respectively. Transistors 50A and 50B may include a source terminals coupled to respective drain terminals of transistors 50C and 50D. Source terminals of transistors 50C and 50D are coupled to ground. An amplitude of a current supplied by current source circuit 36 may be substantially constant and modifiable by selection of a voltage and/or current supplied at bias inputs 57. According another example not depicted, transistors 50A-50D may be replaced by one or more resistors that similarly operate as one or more current sources to provide a bias for differential amplifier stage 4.

Differential amplifier stage 4 may also include Miller compensation circuit 32. In the embodiment of FIG. 2, Miller compensation circuit 32 includes transistors 42A and 42B, each of which include a gate coupled to bias input 54. Bias input 54 includes a resistor 55 coupled to respective gate terminals of transistors 42A and 42B. Also, resistor 55 is coupled to a transistor 56, the drain and source of which are coupled to ground. Transistor 56 and resistor 55 may operate as a filter to remove undesirable components from a signal at bias input 54, e.g. noise. Miller compensation circuit 32 may compensate for the Miller Effect with respect to differential amplifier circuit 34. The Miller Effect is an increase in equivalent input capacitance due to amplification of capacitance between input and output terminals of an inverting voltage amplifier, e.g. differential amplifier circuit 34 of FIG. 2. Miller compensation circuit 32 may reduce an input capacitance of differential amplifier circuit based in part on a signal at bias input 54. In the example of FIG. 2, Miller compensation circuit 32 includes a source terminal of transistor 42A coupled to a drain terminal of transistor 44A of differential amplifier circuit 34, and a source terminal of transistor 42B coupled to a drain terminal of transistor 44B of differential amplifier circuit 34.

Differential amplifier stage 4 also includes active bias circuit 30. Active bias circuit 30 may include resistors 40A and 40B, each of which include a first terminal coupled to a positive power supply terminal (e.g. VDD), and a second terminal coupled to drain terminals of transistors 42A and 42B of Miller compensation circuit 32.

Differential amplifier stage 4 may generate respective first and second polarity signals 14A and 14B of a scaled differential signal, e.g. positive and negative polarity signals of a scaled differential output signal. A gain applied to a signal by differential amplifier stage 4 may not be selectively adjustable.

The examples of differential amplifier stage 4 of FIGS. 2-3 and 5-6 shown herein are provided for exemplary purposes only. Accordingly, differential amplifier stage 4 may be embodied in any number of differential amplification arrangements. Furthermore, a differential amplifier stage may be embodied without certain components depicted in FIG. 2. For example, Miller compensation circuit 32, capacitors 46A and 46B, resistors 48A and 48B, active bias circuit 30, or current source circuit 36 may be excluded, or may be included in different form. In one example, current source circuit 36 may only include a single transistor pair (e.g. transistors 50A and 50B), instead of double transistor pairs (e.g. transistors 50A-50D). Any circuit that outputs a scaled differential output signal in response to a differential input signal is within the scope of this disclosure.

Furthermore, the circuit diagram of FIG. 2 shows differential amplifier stage 4 as including a plurality of NMOS transistors. PMOS implementations of the circuit diagram of FIG. 2, and other circuits shown in FIGS. 3-10 are also contemplated.

FIG. 2 illustrates one example of an amplifier 2A that includes differential amplifier stage 4 and a gain adjust stage 6. Differential amplifier stage 4 may output first and second polarity signals 14A and 14B of a scaled differential signal. Gain adjust stage 6 may receive first and second polarity signals 14A and 14B of the scaled differential signal, and output first and second polarity signals 18A and 18B as a adjusted scaled signal. A level of gain adjustment may be based on a value of adjust signal 22. First and second polarity signals 18A and 18B may define a substantially constant impedance regardless of a value of gain adjust input signal 22.

FIG. 3 is a circuit diagram showing one example of an amplifier 2B that includes a gain adjust stage 6A that includes a source follower circuit 13A consistent with this disclosure. Differential amplifier stage 4 as shown in FIG. 3 is identical to differential amplifier stage 4 of FIG. 2.

As shown in FIG. 3, source follower circuit 13A includes a pair of transistors 62A and 62B, each of which include a gate that receives respective first and second polarity signals 14A and 14B of a scaled differential signal from gain stage 4.

Transistors 62A and 62B depicted in FIG. 3 are n-type metal oxide semiconductor field effect transistors (NMOS transistors). Gain adjust stage 6A may generate first and second polarity signals 18A and 18B of an adjusted scaled differential signal at respective source terminals of transistors 62A and 62B. First and second polarity signals 18A and 18B may define a substantially constant impedance. Drain terminals of transistors 62A and 62B are each respectively coupled to a positive power supply terminal. Although not depicted in FIG. 3, in one example a first end of one or more resistive elements (e.g. resistor, resistor connected transistor) may be coupled to respective source terminals of transistors 62A and 62B. According to this example, first and second polarity signals 18A and 18B may be output at a second end of the one or more resistive elements.

Gain adjust stage 6A also includes variable resistors 64A and 64B. As shown in FIG. 3, variable resistors 64A and 64B are resistor coupled transistors, however other variable resistor elements are also contemplated. Variable resistors 64A and 64B may be coupled between respective source terminals of transistors 62A and 62B. In this arrangement, variable resistors 64A and 64B may cause a portion of a voltage at respective source terminals of transistors 62A and 62B to be dropped across variable resistors 64A and 64B. Since a resistance of variable resistors 64A and 64B may be varied, a gain adjustment of a gain adjust stage 6 may be selected.

Variable resistors 64A and 64B may be adjustable via input terminals 23A and 23B Input terminals 23A and 23B may be, for example, input pins on an integrated circuit device or printed circuit board. A resistance of variable resistors 64A and 64B may be adjusted by applying adjust signal 22 to input terminals 23A and 23B. In one example, adjust signal 22 is a voltage.

In the depicted example of FIG. 3, amplifier 2A further includes current source transistors 52A-52D. Current source transistors 52A-52D may provide a current source bias to transistors 62A and 62B of source follower circuit 13. In another example not depicted, amplifier 2 may not include transistors 52A-52D. Instead, transistors 62A and 62B may be replaced by one or more resistors, which similarly may provide a current bias to gain adjust stage 4.

FIGS. 4A and 4B illustrate examples of input circuits that may be coupled to input terminals 23A and 23B of variable resistors 64A and 64B. In operation, it may be desirable for each of variable resistors 64A and 64B to receive input signals of substantially similar amplitude. For example, in the example of FIG. 4A, adjust signal 22 is single signal 22A applied to each of input terminals 23A and 23B via respective resistors 91 and 92. In the example of FIG. 4B, adjust signal 22 is two signals of substantially similar amplitude 22A' and 22B', each respectively supplied to input terminals 23A and 23B via respective resistors 93 and 94.

Figure 5:
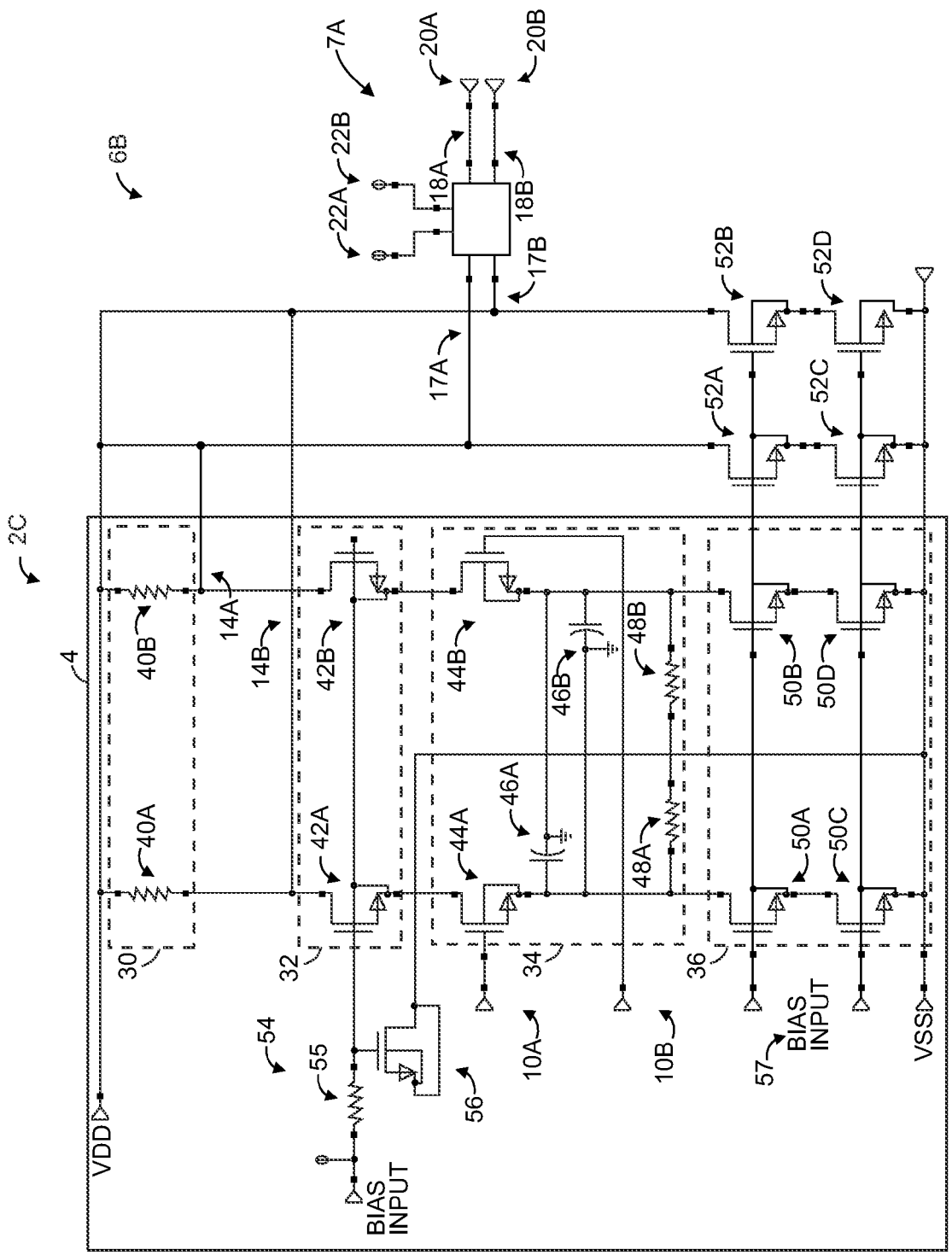
FIG. 5 is a circuit diagram depicting one example of a differential amplifier stage coupled to a gain stage that includes an attenuator circuit consistent with this disclosure.

FIG. 5 is a circuit diagram showing one example of an amplifier 2C that includes a gain adjust stage 6B that includes an attenuator 7A consistent with this disclosure. Differential amplifier stage 4 as shown in FIG. 5 is identical to differential amplifier stage 4 shown in FIG. 2.

As shown in FIG. 5, attenuator 7A receives first polarity signal 14A and second polarity signal 14B of a scaled differential signal from gain stage 4. Attenuator 7A includes attenuation select terminals 24A and 24B. Attenuation select terminals 24A and 24B may receive a signal indicative of an amount of gain adjustment desired, e.g. adjust input 22, and output first and second polarity signals 18A and 18B of an adjusted scaled differential signal. In one example, a signal received at attenuation select inputs 24A and 24B is one or more voltages, where an amplitude of the one or more voltages is selectable to set a desired amount of gain adjustment by attenuator 7A. In one example, a voltage supplied to attenuation select input 24A has a different amplitude than a voltage applied to attenuation select input 24B, and a difference between the amplitude of voltages at inputs 24A and 24B is selectable to set a desired amount of gain adjustment by attenuator 7A. Attenuator 7A may adjust a gain of a scaled differential signal 14A and 14B, and correspondingly generate an adjusted scaled differential signal 18A and 18B as an output of amplifier 2 consistent with a value specified by adjust signal 22. Adjusted scaled differential signal 18A and 18B may have a constant impedance regardless of an amplitude adjustment specified by adjust signal 22.

Figure 7:
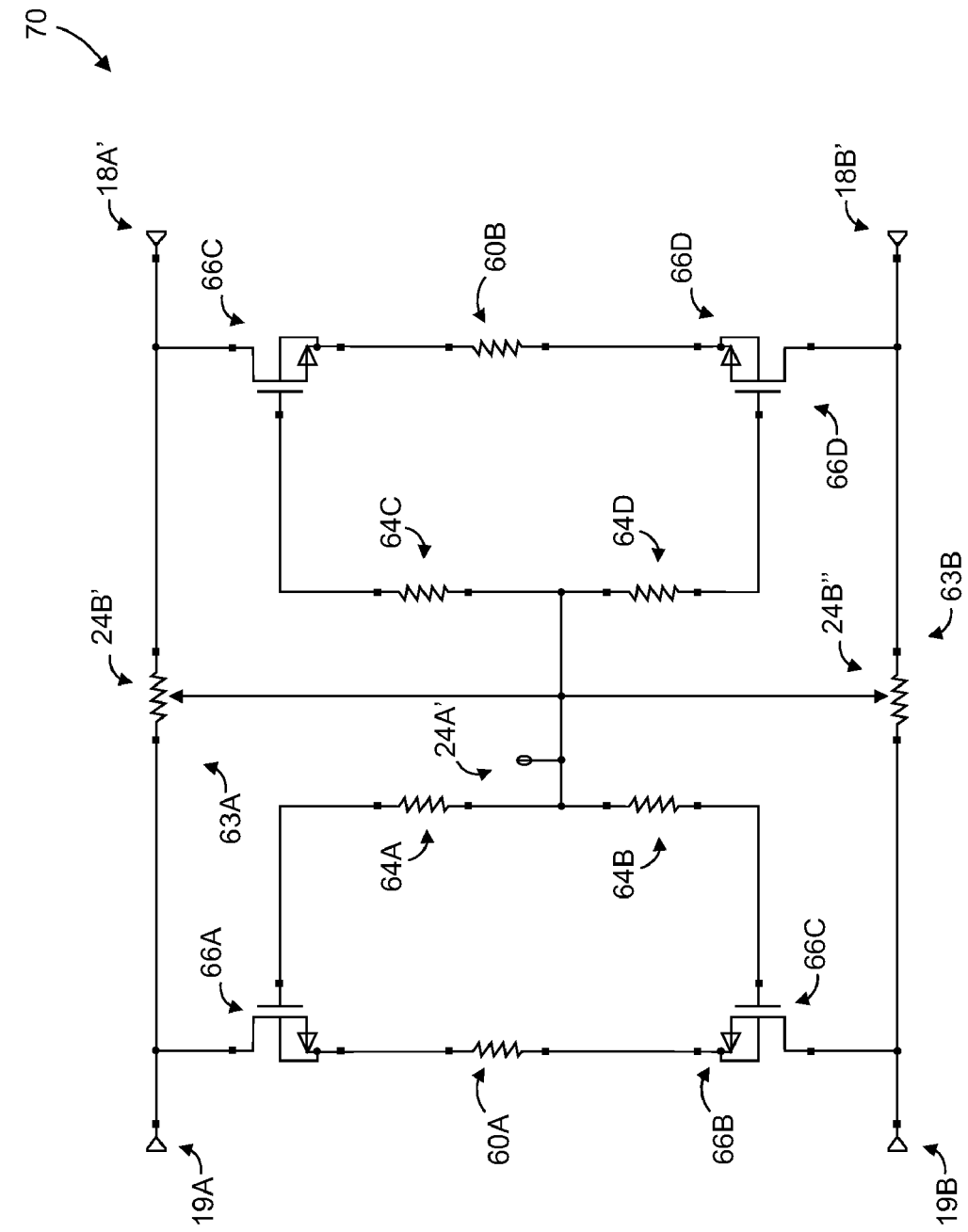
FIG. 7 is a circuit diagram depicting one example of a pi-attenuator circuit consistent with this disclosure.
Figure 8:
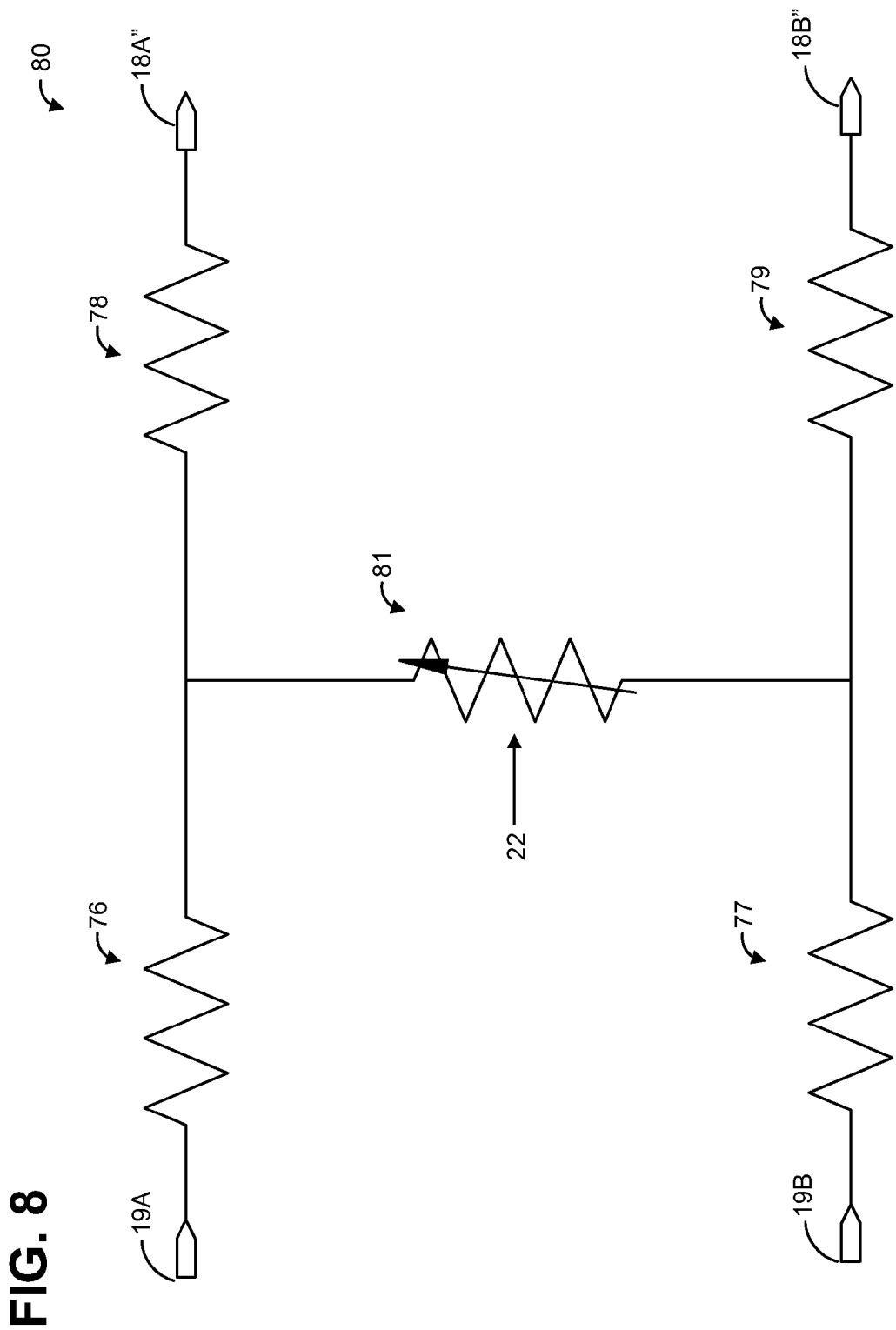
FIG. 8 is a circuit diagram depicting one example of a T-attenuator circuit consistent with this disclosure.

In one example, attenuator 7A is a t-attenuator as depicted in FIG. 8 and discussed in further detail below. In another example, attenuator 7A is a pi attenuator as depicted in FIG. 7 and also discussed in further detail below. Any circuit that adjusts an amplitude of a signal is also contemplated by this disclosure.

Figure 6:
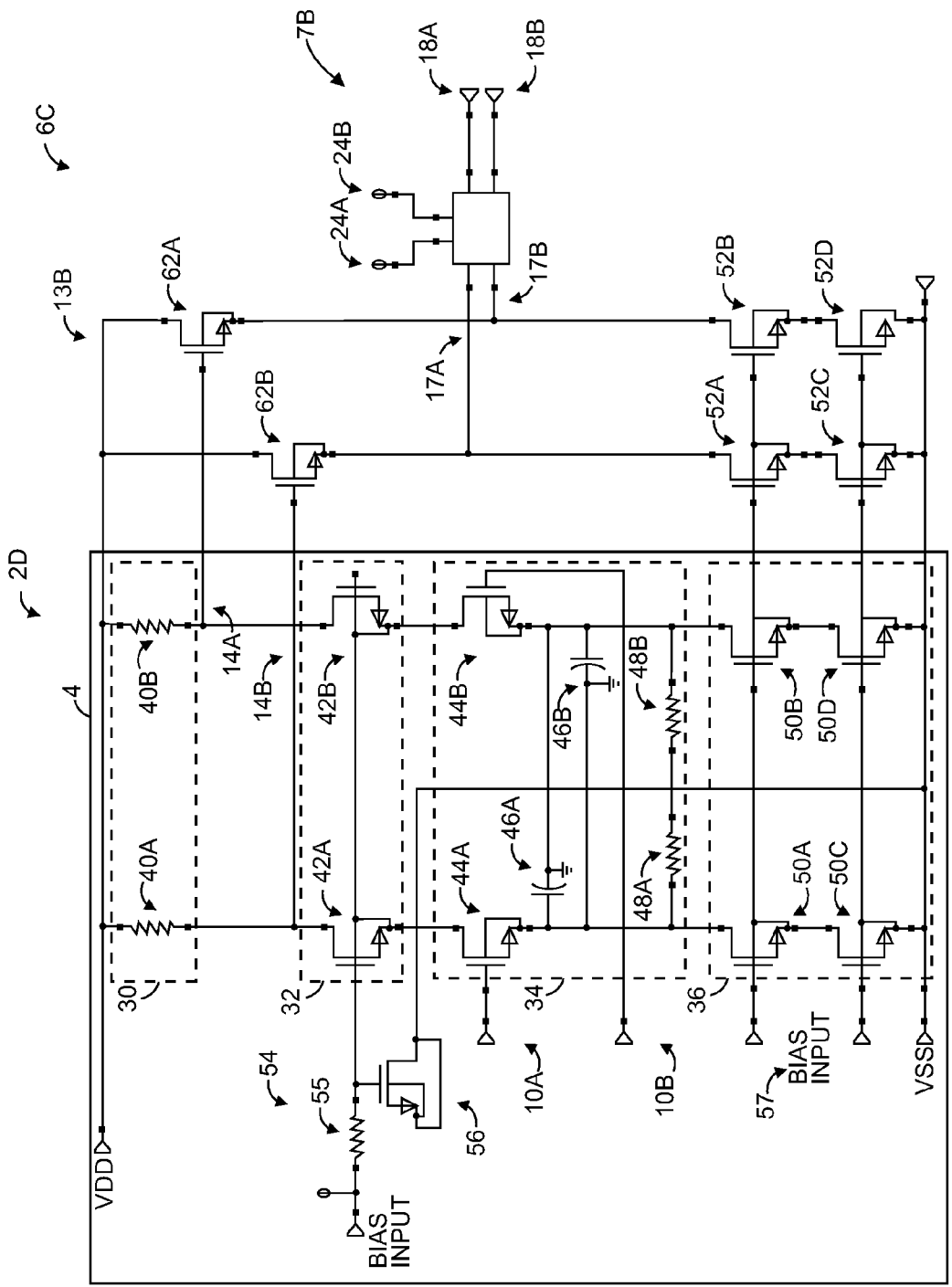
FIG. 6 is a circuit diagram depicting one example of a differential amplifier stage coupled to a gain stage that includes a source follower circuit and an attenuator circuit consistent with this disclosure.

FIG. 6 is a circuit diagram depicting one example of an amplifier 2D that includes a gain adjust stage 6C that includes both a source follower 13B and an attenuator 7B consistent with this disclosure. Differential amplifier stage 4 as shown in FIG. 6 is identical to the differential amplifier stage 4 shown in FIG. 2.

As depicted in FIG. 6, gain adjust stage 6C includes a source follower 13B. Similar to source follower 13A of FIG. 3, source follower circuit 13B includes a pair of transistors 62A and 62B, each of which include a gate terminal that receives respective first and second polarity signals 14A and 14B of a scaled differential signal. Also similar to source follower 13A of FIG. 6, source terminals of transistors 62A and 62B are coupled to transistors 52A-52D as a current source circuit. In another example not depicted, transistors 52A-52D may be replaced by one or more resistors that similarly operate as a current source with respect to source follower 13B. Source follower 13 may output, at source terminals of transistors 62A and 62B, a first and second polarity signals 17A and 17B, respectively, each of which may define a substantially constant impedance.

Attenuator 7B receives first and second polarity signals 17A and 17B. Similar to the attenuator example 7A of FIG. 5, attenuator 7B may adjust an amplitude of first and second polarity signals 17A and 17B and output first and second polarity signals 18A and 18B of an adjusted scaled differential signal. An amplitude adjustment of signals 18A and 18B may be based on one or more signals received at attenuation select terminals 24A and 24B. In one example, adjust signal 22 is received at attenuation select inputs 24A and 24B. Although not depicted in FIG. 6, in one example a first end of one or more resistive elements (e.g. resistor, resistor connected transistor) may be coupled between source terminals of transistors 62A and 62B and attenuator 7B.

In one example, a signal received at attenuation select inputs 24A and 24B is one or more voltages, where an amplitude of the one or more voltages is selectable to set a desired amount of gain adjustment by attenuator 7B. In one example, a voltage supplied to attenuation select input 24A has a different amplitude than a voltage applied to attenuation select input 24B, and a difference between the amplitude of voltages at inputs 24A and 24B is selectable to set a desired amount of gain adjustment by attenuator 7B. Attenuator 7B may output first and second polarity signals 18A and 18B of an adjusted scaled differential signal that define a substantially constant impedance, regardless of a signal at attenuation select terminals 24A and 24B.

FIG. 7 is a circuit diagram depicting one example of an attenuator 70 that is a pi attenuator consistent with the disclosure provided herein. As shown in FIG. 7, attenuator 70 includes input terminals 19A and 19B. Input terminals 19A and 19B may receive a differential signal, such as differential output 14A and 14B of differential amplifier stage 4 as shown in FIG. 5, or a differential output 17A and 17B of source follower 13B as shown in FIG. 6. Attenuator 70 further includes a first attenuation select input 24A' and second attenuation select inputs 24B' and 24B". First attenuation select input 24A' may be coupled to a node between variable resistors 63A and 63B, while second attenuation select inputs 24B' and 24B" may each respectively be coupled to each of variable resistors 63A and 63B independently. Variable resistors 63A and 63B may be selectable such that a resistance of variable resistors 63A and 63B is adjustable based on a difference between a signal applied at attenuation select input 24A' (e.g. attenuation select input 24A in FIGS. 5 and 6) and a signal at attenuation select inputs 24B' and 24B" (e.g. attenuation select input 24B in FIGS. 5 and 6 applied to both inputs 24B' and 24B"). An adjustment of a resistance of variable resistors 63A and 63B may vary an attenuation applied to a signal at inputs 19A and 19B by attenuator 70. Also shown in FIG. 7 are NMOS transistors 66A-D, and resistors 64A-64D, and resistors 60A and 60B. Transistor 66A includes a drain coupled to input terminal 19A and a first end of variable resistor 63A. Transistor 66A includes a gate coupled to a first end of resistor 64A, which includes a second end coupled to first attenuation select input 24A' and a first end of second resistor 64B. A source terminal of transistor 66A is coupled to a source terminal of transistor 66B via resistor 60A. A gate terminal of transistor 66B is coupled to a second end of resistor 64B, and a drain terminal of transistor 66B is coupled to input terminal 19B and a first end of variable resistor 63B. Transistors 66C, 66D, resistors 64A-64D and resistor 60B are arranged in a nearly identical configuration, with respective drain terminals of transistors 66C and 66D coupled to respective output terminals 18A' and 18B' of attenuator 70.

Due to the arrangement depicted in FIG. 7, attenuator 70 may receive a differential input signal at input terminals 19A-19B, and output at output terminals 18A' and 18B' an adjusted scaled differential signal that defines a substantially constant impedance. One of skill in the art will recognize that the pi-attenuator circuit 70 depicted in FIG. 7 is merely one example of a pi-attenuator circuit, and that many variations of this circuit are within the scope of this disclosure. For example, variable resistors 63A and 63B may be embodied as one or more transistors arranged to provide a variable resistance. Similarly, any of resistors 64A-64C and/or 60A-60B may be embodied as one or more resistor connected transistors and/or diodes. Further, NMOS transistors 66A-66D may be replace with PMOS, Bipolar Junction (BJT), or any other types of transistors without departing from the scope of this disclosure.

FIG. 8 is a circuit diagram depicting one example of an attenuator 80 that is a t-attenuator circuit 80 consistent with the disclosure provided herein. As shown in FIG. 8, resistors 76 and 77 each include a first end that receives first and second polarity signals 19A and 19B of a differential signal. According to gain adjust stage 6B of FIG. 5, the first end of resistor 76 receives first polarity signal 14A, and a first end of resistor 77 receives second polarity signal 14B. According to gain adjust stage 6C of FIG. 6, a first end of resistor 76 receives first polarity signal 17A, and a first end of resistor 77 receives second polarity signal 17B.

A second end of resistors 76 and 77 are coupled to respective first and second ends of resistor 78. A second end of resistors 76 and 77 are also coupled to a first end of resistors 78 and 79. As depicted in FIG. 8, resistor 81 may be a variable resistor. Resistor 81 may receive a signal indicative of a desired level of amplitude adjustment of attenuator 80, e.g. adjust signal 22.

Resistors 78 and 79 each include respective second ends. The respective second ends may output respective first and second polarity signals 18A and 18B of an adjusted scaled signal. Resistors 76, 77, 78, 79, and 81 may operate as a voltage divider and thus attenuate a signal at inputs 19A and 19B and output an adjusted scaled differential signal 18A" and 18B". A level of amplitude adjustment of attenuator 80 may be selected by an input signal to variable resistor 81, e.g. adjust signal 22.

Figure 9:
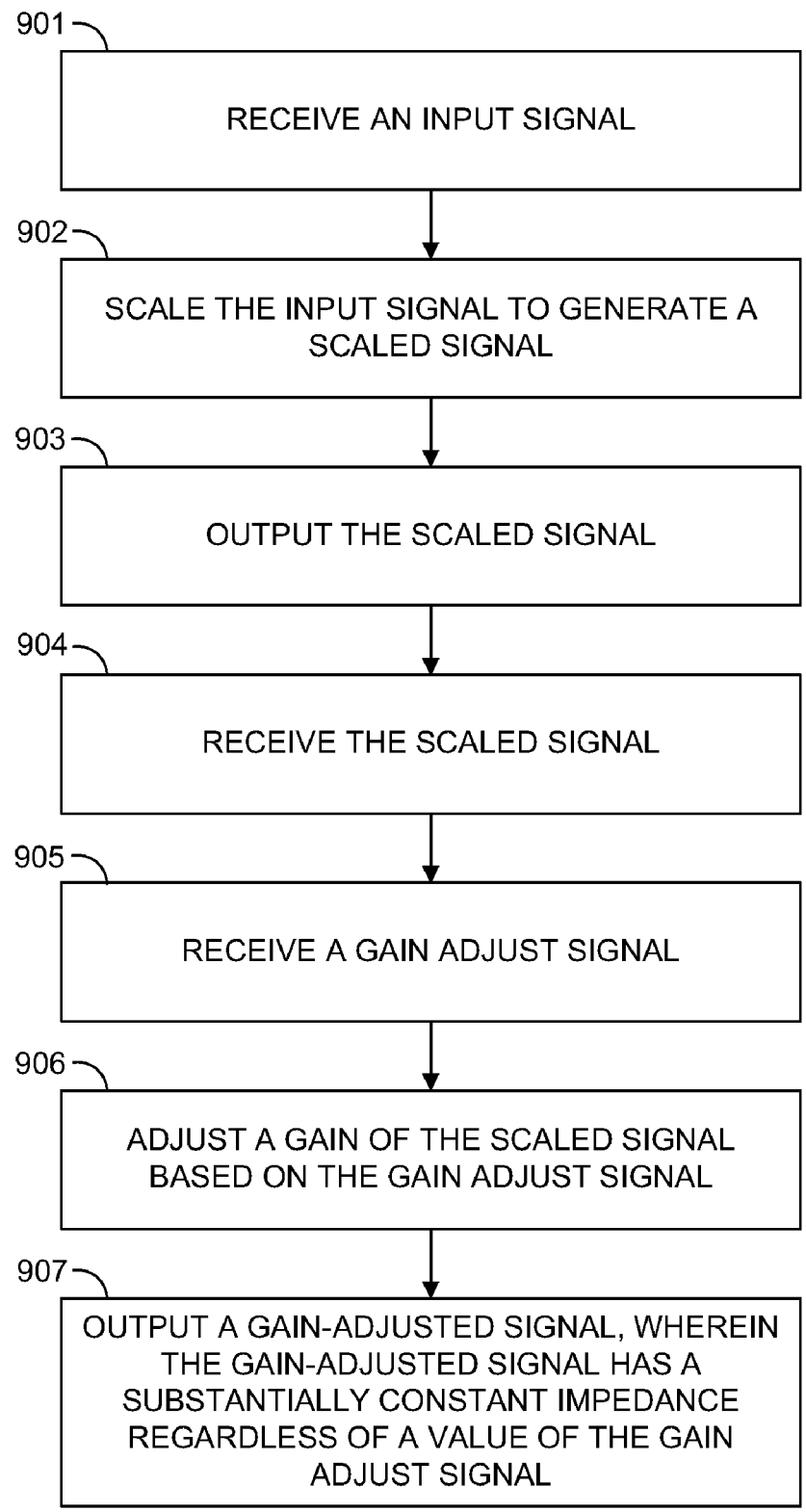
FIG. 9 is a flow chart diagram depicting a method of generating an adjustable gain output signal consistent with this disclosure.

FIG. 9 is a flow chart diagram that depicts a method of generating a gain controlled output signal consistent with the disclosure provided herein. Differential amplifier stage 4 may receive an input signal 10A, 10B (901). Differential amplifier stage 4 may scale the input signal 10A, 10B to generate a scaled signal 14A, 14B (902). Differential amplifier stage 4 may output the scaled signal 14A, 14B (903). Gain adjust stage 6 may receive the scaled signal 14A, 14B (904). Gain adjust stage 6 may receive an adjust signal 22 (905). Gain adjust stage 6 may adjust an amplitude of the scaled signal 14A, 14B based on adjust signal 22 to generate an adjusted scaled signal 18A, 18B (906). Gain adjust stage may output the adjusted scaled signal 18A, 18B. The adjusted scaled signal 18A, 18B may have a substantially constant impedance regardless of a value of the adjust signal 22 (907).

Various embodiments of the invention have been described. These and other embodiments are within the scope of the following claims.

The invention claimed is:

1. An amplifier device, comprising:
   a differential amplifier gain stage that receives an input signal and applies a gain to the input signal to generate a scaled signal at an output node of the differential amplifier gain stage; and
   a gain adjust stage different than the differential amplifier gain stage that receives the scaled signal from the output node of the differential amplifier gain stage and an adjust signal and adjusts an amplitude of the scaled signal based on the adjust signal and outputs an adjusted scaled signal at an output node of the gain adjust stage, wherein the output node of the gain adjust stage has a substantially constant impedance regardless of a value of the adjust signal.

2. The device of claim 1, wherein the gain adjust stage outputs the adjusted scaled signal at a substantially constant impedance regardless of a magnitude of the input signal.

3. The device of claim 1, wherein the gain adjust stage comprises a source follower circuit.

4. The device of claim 3, further comprising:
   at least one variable resistor coupled to the source follower circuit, wherein the at least one variable resistor has a selectable resistance based on the adjust signal.

5. The device of claim 1, wherein the gain adjust stage includes an attenuator circuit.

6. The device of claim 5, wherein the attenuator circuit is a pi-attenuator circuit.

7. The device of claim 5, wherein the attenuator circuit is a T-attenuator circuit.

8. The device of claim 5, wherein the gain adjust stage further includes a source follower circuit.

9. A method, comprising:
receiving, at a differential amplifier stage, an input signal;
scaling, by the differential amplifier stage, the input signal to generate a scaled signal at an output node of the differential amplifier stage;
receiving, at a gain adjust stage different than the differential amplifier stage, the scaled signal from the output node of the differential amplifier gain stage;
receiving, at the gain adjust stage, an adjust signal;
adjusting an amplitude of the scaled signal by the gain adjust stage based on the adjust signal;
outputting, at an output terminal of the gain adjust stage an adjusted scaled signal, wherein the output terminal of the gain adjust stage has a substantially constant impedance regardless of a value of the adjust signal.

10. The method of claim 9, wherein outputting the adjusted scaled signal includes outputting at a substantially constant impedance regardless of a magnitude of the input signal.

11. The method of claim 9, wherein outputting the adjusted scaled signal includes outputting by a source follower circuit.

12. The method of claim 11, wherein adjusting an amplitude of the scaled signal includes adjusting the amplitude based on a resistance of at least one variable resistor coupled to the source follower circuit.

13. The method of claim 11, wherein adjusting an amplitude of the scaled signal includes adjusting the amplitude by at least one attenuator circuit coupled to an output of the source follower circuit.

14. The method of claim 9, wherein adjusting the amplitude of the scaled signal includes adjusting the amplitude by an attenuator circuit.

15. The method of claim 14, wherein adjusting the amplitude by an attenuator circuit includes adjusting the amplitude by a pi-attenuator circuit.

16. The method of claim 14, wherein adjusting the amplitude by an attenuator circuit includes adjusting the amplitude by a T-attenuator circuit.

17. A device, comprising:
means for receiving, at a differential amplifier stage, an input signal;
means for scaling, by the differential amplifier stage, the input signal to generate a scaled signal at an output node of the differential amplifier stage;
means for receiving, at a gain adjust stage different than the differential amplifier stage, the scaled signal from the output node of the differential amplifier gain stage;
means for receiving, at the gain adjust stage, an adjust signal;
means for adjusting, by the gain adjust stage, an amplitude of the scaled signal based on the adjust signal;
means for outputting, at an output terminal of the gain adjust stage, an adjusted scaled signal, wherein the output terminal of the gain adjust stage has a substantially constant impedance regardless of a value of the adjust signal.

18. The device of claim 17, wherein the means for adjusting an amplitude of the scaled signal include an attenuator circuit.

19. The device of claim 17, wherein the means for adjusting the amplitude of the scaled signal include an attenuator circuit coupled to an output of a source follower circuit.

20. The device of claim 8, wherein the attenuator circuit is coupled to an output of the source follower circuit.

* * * * *